United States Patent
Zhang et al.

(10) Patent No.: US 11,164,725 B2
(45) Date of Patent: Nov. 2, 2021

(54) GENERATION OF HYDROGEN REACTIVE SPECIES FOR PROCESSING OF WORKPIECES

(71) Applicants: Mattson Technology, Inc., Fremont, CA (US); Beijing E-Town Semiconductor Technology Co., Ltd., Beijing (CN)

(72) Inventors: Qi Zhang, San Jose, CA (US); Xinliang Lu, Fremont, CA (US); Hua Chung, Saratoga, CA (US); Michael X. Yang, Palo Alto, CA (US)

(73) Assignees: Beijing E-Town Semiconductor Technology Co., Ltd., Beijing (CN); Mattson Technology, Inc., Fremont, CA (US)

( * ) Notice: Subject to any disclaimer, the term of this patent is extended or adjusted under 35 U.S.C. 154(b) by 0 days.

(21) Appl. No.: 16/420,542

(22) Filed: May 23, 2019

(65) Prior Publication Data
US 2019/0378692 A1    Dec. 12, 2019

Related U.S. Application Data

(60) Provisional application No. 62/683,246, filed on Jun. 11, 2018.

(51) Int. Cl.
*H01J 37/22*     (2006.01)
*H01L 21/67*    (2006.01)
(Continued)

(52) U.S. Cl.
CPC ............ *H01J 37/3244* (2013.01); *B08B 7/00* (2013.01); *C01B 3/02* (2013.01); *H01J 37/321* (2013.01);
(Continued)

(58) Field of Classification Search
None
See application file for complete search history.

(56) References Cited

U.S. PATENT DOCUMENTS 5,811,022 A    9/1998    Savas et al.
6,028,015 A    2/2000    Wang
(Continued)

FOREIGN PATENT DOCUMENTS

| KR | 2002-0059880 | | 7/2002 |
|---|---|---|---|
| KR | 20020059880 A | * | 7/2002 |
| KR | 2013-0056595 | | 5/2013 |

OTHER PUBLICATIONS

English Machine Translation of KR-20020059880-A.*
(Continued)

*Primary Examiner* — Mikhail Kornakov
*Assistant Examiner* — Pradhuman Parihar
(74) *Attorney, Agent, or Firm* — Dority & Manning, P.A.

(57) ABSTRACT

Methods, systems, and apparatus for generating hydrogen radicals for processing a workpiece, such as a semiconductor workpiece, are provided. In one example implementation, a method can include generating one or more species in a plasma chamber from an inert gas by inducing a plasma in the inert gas using a plasma source; mixing hydrogen gas with the one or more species to generate one or more hydrogen radicals; and exposing the workpiece in a processing chamber to the one or more hydrogen radicals.

13 Claims, 6 Drawing Sheets

(51) Int. Cl.
  *H01L 21/02* (2006.01)
  *B08B 7/00* (2006.01)
  *C01B 3/02* (2006.01)
  *H01J 37/32* (2006.01)

(52) U.S. Cl.
  CPC .. *H01J 37/32357* (2013.01); *H01J 37/32422* (2013.01); *H01L 21/02057* (2013.01); *H01L 21/67028* (2013.01); *H01J 2237/006* (2013.01); *H01J 2237/335* (2013.01)

(56) References Cited

U.S. PATENT DOCUMENTS

| | | | |
|---|---|---|---|
| 6,805,139 | B1 | 10/2004 | Savas et al. |
| 7,414,700 | B2 | 8/2008 | Van Herpen et al. |
| 7,807,579 | B2 | 10/2010 | Yang et al. |
| 7,901,743 | B2 | 3/2011 | Lee et al. |
| 9,371,579 | B2 | 6/2016 | Varadarajan et al. |
| 9,397,196 | B2 | 7/2016 | Sim et al. |
| 9,837,270 | B1 * | 12/2017 | Varadarajan ...... H01L 21/76831 |
| 10,269,574 | B1 | 4/2019 | Yang et al. |
| 10,403,492 | B1 | 9/2019 | Yang et al. |
| 10,804,109 | B2 | 10/2020 | Yang et al. |
| 2002/0058397 | A1 | 5/2002 | Smith et al. |
| 2002/0092541 | A1 * | 7/2002 | Yokogawa ........ H01L 21/02046 134/1.2 |
| 2003/0042465 | A1 | 3/2003 | Ko |
| 2003/0134051 | A1 | 7/2003 | Jung et al. |
| 2004/0154743 | A1 * | 8/2004 | Savas ...................... G03F 7/427 156/345.5 |
| 2006/0081273 | A1 | 4/2006 | McDermott |
| 2008/0261405 | A1 | 10/2008 | Yang |
| 2008/0293248 | A1 | 11/2008 | Park et al. |
| 2009/0274610 | A1 | 11/2009 | Ghoanneviss et al. |
| 2010/0093187 | A1 | 4/2010 | Lee et al. |
| 2011/0117751 | A1 | 5/2011 | Sonthalia |
| 2012/0285481 | A1 | 11/2012 | Lee et al. |
| 2013/0034968 | A1 | 2/2013 | Zhang et al. |
| 2014/0120712 | A1 * | 5/2014 | Ganguli ................. C23C 16/32 438/592 |
| 2015/0126027 | A1 | 5/2015 | Matsumoto |
| 2015/0303065 | A1 | 10/2015 | Buckalew |
| 2016/0079062 | A1 | 3/2016 | Zheng |
| 2016/0260616 | A1 | 9/2016 | Li et al. |
| 2017/0271446 | A1 * | 9/2017 | Joshi ................... H01L 29/0865 |
| 2017/0372899 | A1 * | 12/2017 | Yang ....................... C23C 16/26 |
| 2019/0318937 | A1 | 10/2019 | Yang et al. |
| 2020/0161094 | A1 | 5/2020 | Zhang et al. |
| 2020/0299839 | A1 | 9/2020 | Yabe et al. |

OTHER PUBLICATIONS

International Search Report and Written Opinion for corresponding PCT Application No. PCT/US2019/033773, dated Sep. 11, 2019, 11 pages.

International Preliminary Report on Patentability for Application No. PCT/US2019/033773, dated Dec. 24, 2020, 8 pages.

\* cited by examiner

GENERATION OF HYDROGEN REACTIVE SPECIES FOR PROCESSING OF WORKPIECES

PRIORITY CLAM

The present application claims the benefit of priority of U.S. Provisional Application Ser. No. 62/683,246 titled "Generation of Hydrogen Reactive Species for Processing of Workpieces," filed on Jun. 11, 2018, which is incorporated herein by reference for all purposes.

FIELD

The present disclosure relates generally to generation of hydrogen reactive species for processing of workpieces using, for instance, a plasma processing apparatus.

BACKGROUND

In semiconductor processing, device dimension and materials thickness continue to decrease with shrinking critical dimension in semiconductor devices. In advanced device nodes, materials surface properties and interface integrity become increasingly important to device performance.

SUMMARY

Aspects and advantages of embodiments of the present disclosure will be set forth in part in the following description, or may be learned from the description, or may be learned through practice of the embodiments.

One example aspect of the present disclosure is directed to a method for processing a workpiece. The method can include generating one or more species in a plasma chamber from an inert gas by inducing a plasma in the inert gas using a plasma source. The method can include mixing hydrogen gas with the one or more species to generate one or more hydrogen radicals. The method can include exposing the workpiece in a processing chamber to the one or more hydrogen radicals.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
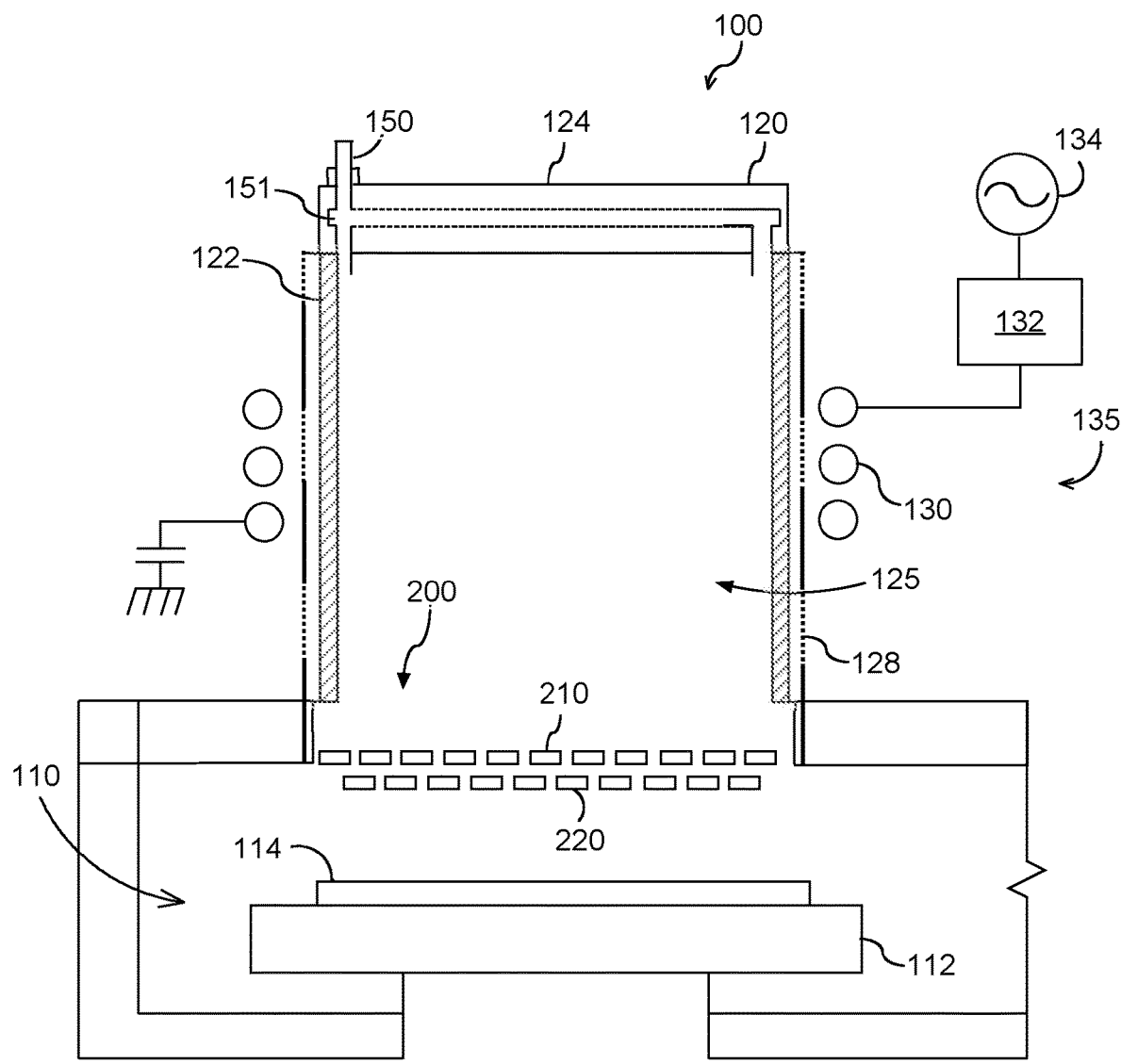
FIG. 1 depicts an example plasma processing apparatus according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to generation of hydrogen radicals for processing of a workpiece, such as a semiconductor workpiece. Hydrogen radicals have various applications in semiconductor processing. For instance, at low temperature, hydrogen radicals can remove photoresist or other polymer materials effectively with reduced underlying materials damage and/or oxidation. At high temperature, hydrogen radicals can selectively etch damaged silicon materials (e.g. for silicon fin trimming in three-dimensional FINFET structures).

Hydrogen radicals can be generated, for instance, by passing a hydrogen gas through a hot wire (e.g., a tungsten hot wire). Hydrogen radicals can be generated, for instance, using capacitive and/or inductive plasma sources. For instance, hydrogen radicals can be generated from a process gas using an inductively coupled plasma source in a remote plasma chamber. Ion filtering can be implemented, for instance, using a grounded separation grid to reduce ions generated in the plasma and allow neutral hydrogen radicals to pass through the grid. The grid can have a distribution of holes to facilitate control of radical distribution. Energy of the hydrogen radicals can be controlled, for instance, using pulsed RF power applied to the power source and/or via post-plasma modification (e.g., mixing of other gases).

According to example embodiments, an inert gas (e.g., helium, argon, xenon, neon, etc.) can be activated using a plasma source in a plasma chamber to generate excited species from the inert gas. A hydrogen gas can be mixed with the excited species (e.g., outside of the plasma chamber, such as downstream of the plasma chamber) to generate one or more hydrogen radicals. The hydrogen radicals can be exposed to a workpiece (e.g., in a processing chamber) to implement various semiconductor fabrication processes.

In some embodiments, the method can include generating one or more excited inert gas molecules (e.g., excited He molecules) in a plasma chamber that is separated from a processing chamber by a separation grid. The excited inert gas molecules can be generated, for instance, by inducing a plasma in a process gas using a plasma source (e.g., inductive plasma source, capacitive plasma source, etc.). The process gas can be an inert gas. For instance, the process gas can be helium, argon, xenon, neon, or other inert gas. In some embodiments, the process gas can consist of an inert gas.

The method can include filtering ions while allowing the passage of neutral species to generate a filtered mixture with neutral radicals for exposure to the workpiece. For instance, a separation grid can be used to filter ions generated in the plasma chamber and allow passage of neutral species through holes in the separation grid to the processing chamber for exposure to the workpiece.

In some embodiments, the hydrogen radicals can be generated by mixing hydrogen gas ($H_2$) with the excited species at or below (e.g., downstream) of the separation grid. For instance, in some embodiments, the separation grid can have a plurality of grid plates. The hydrogen gas can be injected into species passing through the separation grid at a location below or downstream of one of the grid plates. In some embodiments, the hydrogen gas can be injected into species passing through the separation grid at a location between two grid plates. In some embodiments, the hydrogen gas can be injected into the species at a location beneath all of the grid plates (e.g., in the processing chamber).

Mixing the hydrogen gas with the excited species from the inert gas can result in the generation of one or more hydrogen radicals, such as neutral hydrogen radicals. The hydrogen radicals can be exposed to a workpiece in the processing chamber.

In some embodiments, the workpiece can be supported on a pedestal or workpiece support. The pedestal or workpiece support can include a temperature regulation system (e.g., one or more electrical heaters) used to control a temperature of the workpiece temperature during processing. In some embodiments, process can be carried out with the workpiece at a temperature in the range of about 20° C. to about 500° C.

The hydrogen radicals can be exposed to a workpiece in the processing chamber for implementation of a variety of different semiconductor fabrication processes. For example, the hydrogen radicals can be used for removal of a photoresist layer on the workpiece. As another example, the hydrogen radicals can be used to remove a residual (e.g., residual organic) on the workpiece to clean the workpiece. As another example, the hydrogen radicals can be used to assist with silicon atom mobility and smoothing of the workpiece surface (e.g., at high temperatures such as temperatures greater than about 400° C.). As another example, the hydrogen radicals can be used to at least partially remove a damaged silicon layer on the workpiece. As yet another example, the hydrogen radicals can be used to remove a suboxide layer on the workpiece. The hydrogen radicals can be used to implement other semiconductor process applications without deviating from the scope of the present disclosure.

In some embodiments, a metal-containing gas can be mixed with the one or more hydrogen radicals to facilitate deposition of a thin metal film on the workpiece. In some embodiments, the metal can be titanium. In some embodiments, the metal can be tantalum. In some embodiments, the metal can be aluminum.

Aspects of the present disclosure are discussed with reference to a "wafer" or semiconductor wafer for purposes of illustration and discussion. Those of ordinary skill in the art, using the disclosures provided herein, will understand that the example aspects of the present disclosure can be used in association with any semiconductor substrate or other suitable substrate. "Downstream" in reference to a plasma chamber refers to a location in plasma processing apparatus that is exposed to species generated in the plasma chamber, such as a location outside the plasma chamber that is exposed to species generated in the plasma chamber. In addition, the use of the term "about" in conjunction with a numerical value is intended to refer to within ten percent (10%) of the stated numerical value. A "pedestal" refers to any structure that can be used to support a workpiece.

FIG. 1 depicts an example plasma processing apparatus 100 that can be used to perform processes according to example embodiments of the present disclosure. As illustrated, plasma processing apparatus 100 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of workpiece 114 through a separation grid assembly 200.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 1, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

Figure 2:
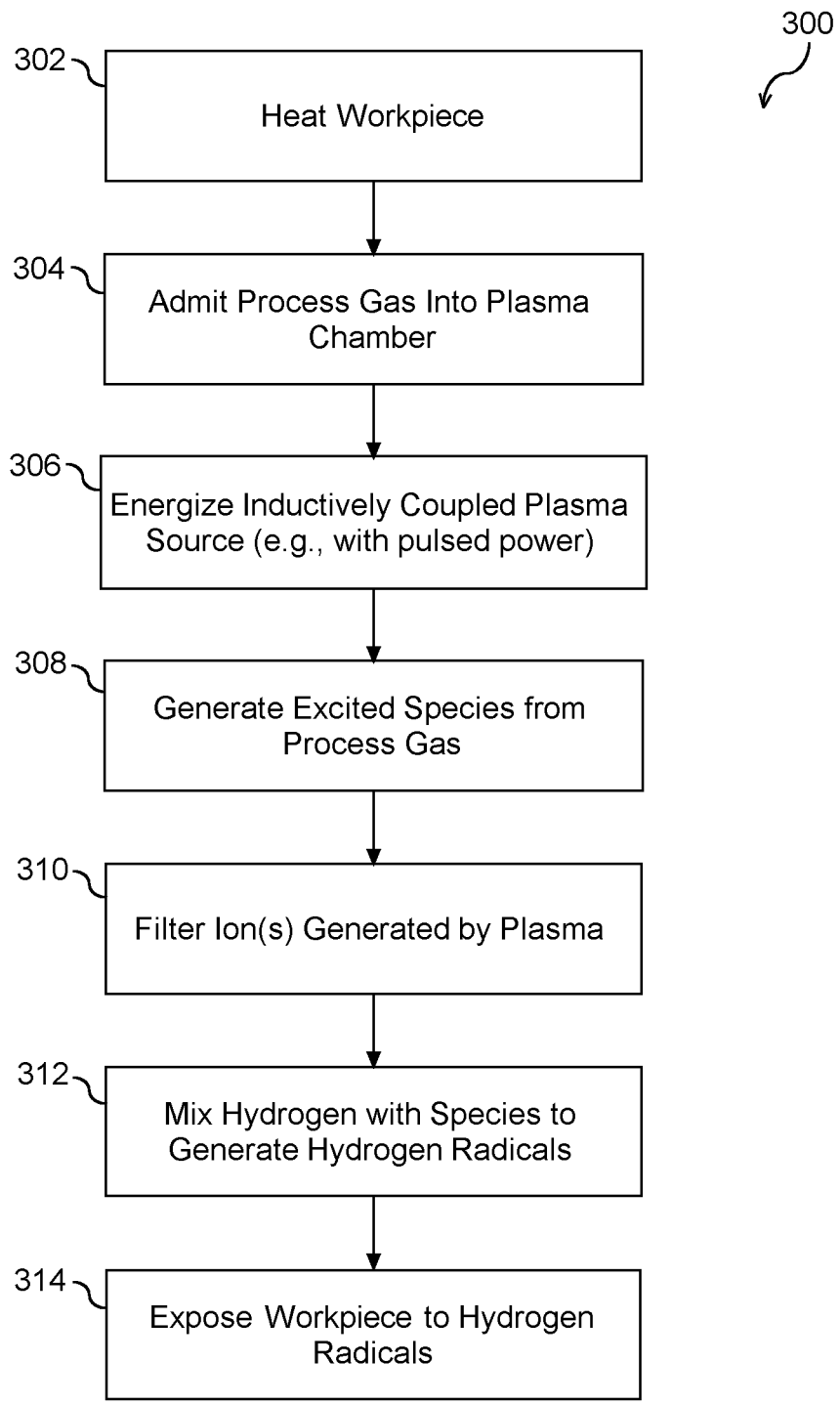
FIG. 2 depicts a flow diagram of an example method according to example embodiments of the present disclosure.

FIG. 2 depicts a flow diagram of an example method (300) according to example aspects of the present disclosure. The method (300) can be implemented using the plasma processing apparatus 100. However, as will be discussed in detail below, the methods according to example aspects of the present disclosure can be implemented using other approaches without deviating from the scope of the present disclosure. FIG. 2 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (302), the method can include heating the workpiece. For instance, the workpiece 114 can be heated in the processing chamber to a process temperature. The workpiece 114 can be heated, for instance, using one or more heating systems associated with the pedestal 112. In some embodiments, the workpiece can be heated to a process temperature in the range of about 20° C. to about 500° C., such as about 400° C. or any other temperature or range of temperatures therebetween.

At (304), the method can include admitting a process gas (e.g., an inert gas) into the plasma chamber. For instance, a process gas can be admitted into the plasma chamber interior 125 from a gas source 150 via annular gas distribution channel 151 or other suitable gas introduction mechanism. The process gas can be an inert gas, such as an inert gas with no reactive gas. For instance, the process gas can consist of the inert gas. The process gas can be, for instance, helium, argon, xenon, neon or other inert gas.

At (306), the method can include energizing an inductively coupled plasma source to generate a plasma in a plasma chamber. For instance, induction coil 130 can be energized with RF energy from RF power generator 134 to generate a plasma in the plasma chamber interior 125. In some embodiments, the inductively coupled power source can be energized with pulsed power to obtain species with desired plasma energy. At (308), the plasma can be used to generate one or more species (e.g., excited inert gas molecules) from the process gas.

At (310), the method can include filtering one or more ions generated by the plasma in the mixture to create a filtered mixture. The filtered mixture can include species (e.g., excited inert gas molecules, etc.) generated by the plasma in the process gas. In some embodiments, the one or more ions can be filtered using a separation grid assembly separating the plasma chamber from a processing chamber where the workpiece is located. For instance, separation grid 200 can be used to filter ions generated by the plasma.

The separation grid 200 can have a plurality of holes. Charged particles (e.g., ions) can recombine on the walls in their path through the plurality of holes. Neutral particles (e.g., radicals) can pass through the holes. In some embodiments, the separation grid 200 can be configured to filter ions with an efficiency greater than or equal to about 90%, such as greater than or equal to about 95%.

In some embodiments, the separation grid can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

At (312), the method can include mixing hydrogen (e.g., $H_2$ gas) with the species to generate one or more hydrogen radicals. The hydrogen can be mixed with the species by injecting a gas into post plasma mixtures (e.g., at or below a separation grid).

Figure 3:
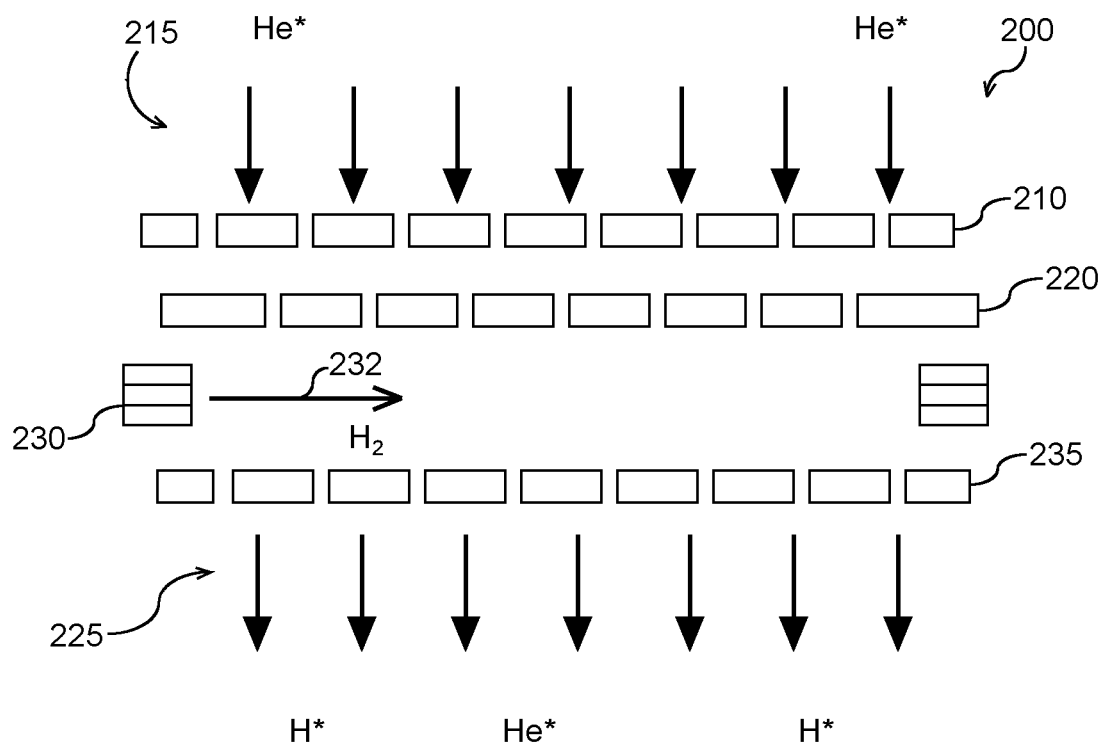
FIG. 3 depicts example mixing of a hydrogen gas with one or more species generated from an inert gas according to example embodiments of the present disclosure.

FIG. 3 depicts an example separation grid 200 for injection of hydrogen post plasma according to example embodiments of the present disclosure. More particularly, the separation grid 200 includes a first grid plate 210 and a second grid plate 220 disposed in parallel relationship. The first grid plate 210 and the second grid plate 220 can provide for ion/UV filtering.

The first grid plate 210 and a second grid plate 220 can be in parallel relationship with one another. The first grid plate 210 can have a first grid pattern having a plurality of holes. The second grid plate 220 can have a second grid pattern having a plurality of holes. The first grid pattern can be the same as or different from the second grid pattern. Species (e.g., excited inert gas molecules) 215 from the plasma can be exposed to the separation grid 200. Charged particles (e.g., ions) can recombine on the walls in their path through the holes of each grid plate 210, 220 in the separation grid 200. Neutral species (e.g., excited inert gas molecules) can flow relatively freely through the holes in the first grid plate 210 and the second grid plate 220.

Subsequent to the second grid plate 220, a gas injection source 230 can be configured to mix hydrogen 232 into the species passing through the separation grid 200. A mixture 225 including hydrogen radicals resulting from the injection of hydrogen gas can pass through a third grid plate 235 for exposure to the workpiece in the processing chamber.

The present example is discussed with reference to a separation grid with three grid plates for example purposes. Those of ordinary skill in the art, using the disclosures provided herein, will understand that more or fewer grid plates can be used without deviating from the scope of the present disclosure. In addition, the hydrogen can be mixed with the species at any point in the separation grid and/or after the separation grid in the processing chamber. For instance, the gas injection source 230 can be located between first grid plate 210 and second grid plate 220.

Figure 4:
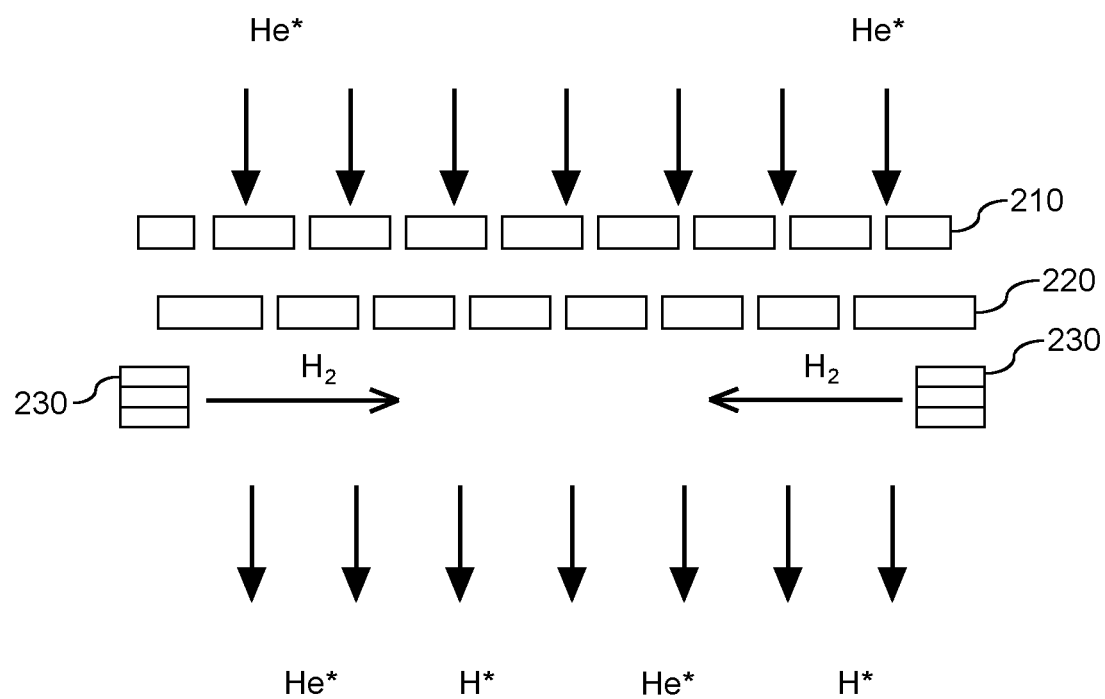
FIG. 4 depicts example mixing of a hydrogen gas with one or more species generated from an inert gas according to example embodiments of the present disclosure.

As shown in FIG. 4, in some embodiments, the grid assembly 200. For instance, the gas injection source 230 can inject hydrogen gas into the species passing through the separation grid 200 at a location in the processing chamber below a first grid plate 210 and a second grid plate 220.

At (314) of FIG. 2, the method can include exposing the workpiece to the hydrogen radicals. Exposing the workpiece to the hydrogen radicals can be used to perform a variety of semiconductor fabrication steps.

For example, the hydrogen radicals can be exposed to a workpiece in the processing chamber for implementation of a variety of different semiconductor fabrication processes. For example, the hydrogen radicals can be used for removal of a photoresist layer on the workpiece. As another example, the hydrogen radicals can be used to remove a residual (e.g., residual organic) on the workpiece to clean the workpiece. As another example, the hydrogen radicals can be used to assist with silicon atom mobility and smoothing of the workpiece surface (e.g., at high temperatures such as temperatures greater than about 400° C.). As another example, the hydrogen radicals can be used to at least partially remove a damaged silicon layer on the workpiece. As yet another example, the hydrogen radicals can be used to remove a suboxide layer on the workpiece. The hydrogen radicals can be used to implement other semiconductor process applications without deviating from the scope of the present disclosure.

In some embodiments, a metal-containing gas can be mixed with the one or more hydrogen radicals to facilitate deposition of a thin metal film on the workpiece. In some embodiments, the metal can be titanium. In some embodiments, the metal can be tantalum. In some embodiments, the metal can be aluminum.

Figure 5:
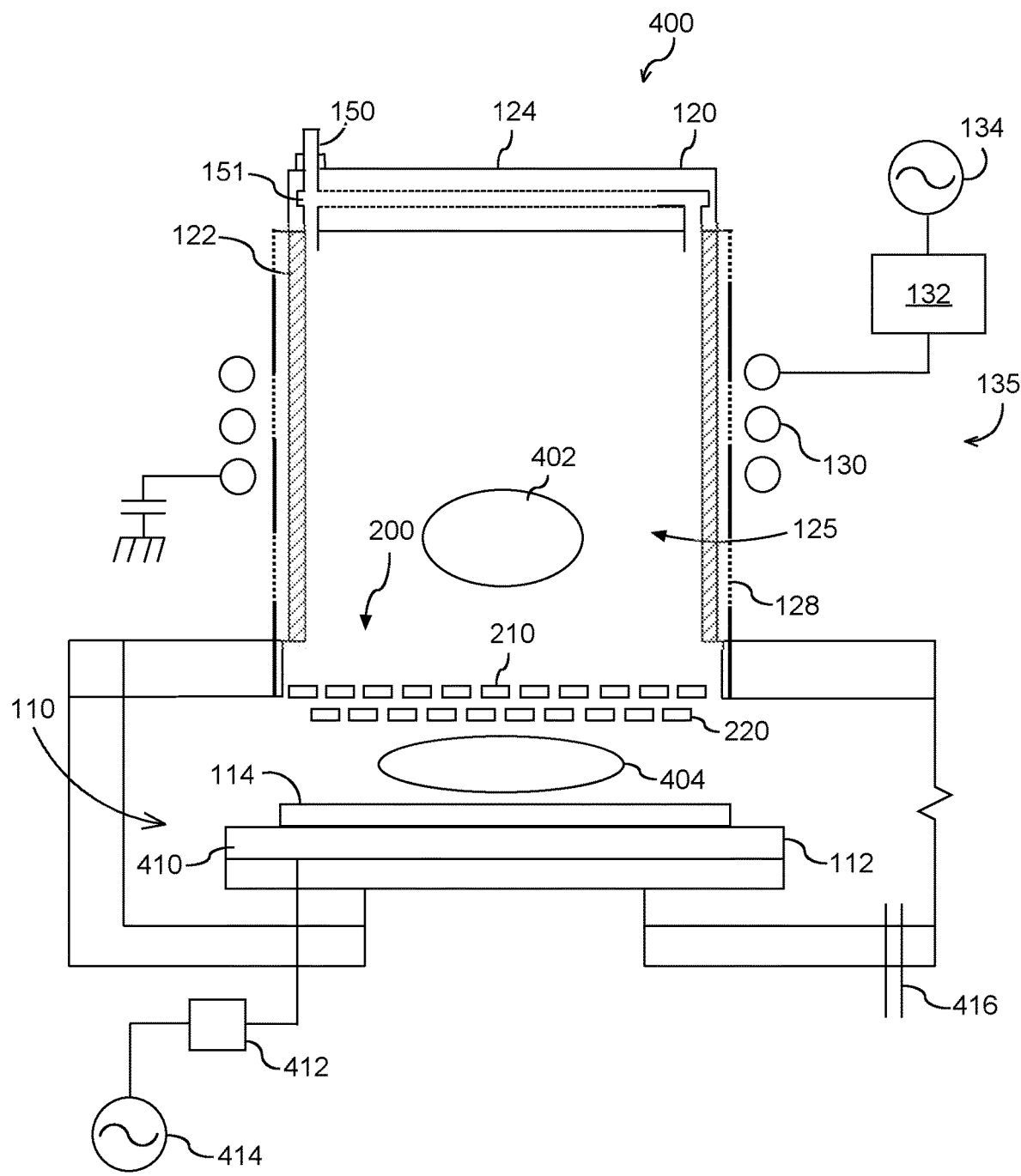
FIG. 5 depicts an example plasma processing apparatus according to example embodiments of the present disclosure.

FIG. 5 depicts an example plasma processing apparatus 400 that can be used to implement processes according to example embodiments of the present disclosure. The plasma processing apparatus 400 is similar to the plasma processing apparatus 100 of FIG. 1.

More particularly, plasma processing apparatus 400 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of workpiece 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 5, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

As discussed above, a hydrogen gas can be injected into species passing through the separation grid 200 to generate one or more hydrogen radicals for exposure to the workpiece 114. The hydrogen radicals can be used to implement a variety of semiconductor fabrication processes.

The example plasma processing apparatus 400 of FIG. 5 is operable to generate a first plasma 402 (e.g., a remote plasma) in the plasma chamber 120 and a second plasma 404 (e.g., a direct plasma) in the processing chamber 110. As used herein, a "remote plasma" refers to a plasma generated remotely from a workpiece, such as in a plasma chamber separated from a workpiece by a separation grid. As used herein, a "direct plasma" refers to a plasma that is directly exposed to a workpiece, such as a plasma generated in a processing chamber having a pedestal operable to support the workpiece.

More particularly, the plasma processing apparatus 400 of FIG. 5 includes a bias source having bias electrode 410 in the pedestal 112. The bias electrode 410 can be coupled to an RF power generator 414 via a suitable matching network 412. When the bias electrode 410 is energized with RF energy, a second plasma 404 can be generated from a mixture in the processing chamber 110 for direct exposure to the workpiece 114. The processing chamber 110 can include a gas exhaust port 416 for evacuating a gas from the processing chamber 110.

Figure 6:
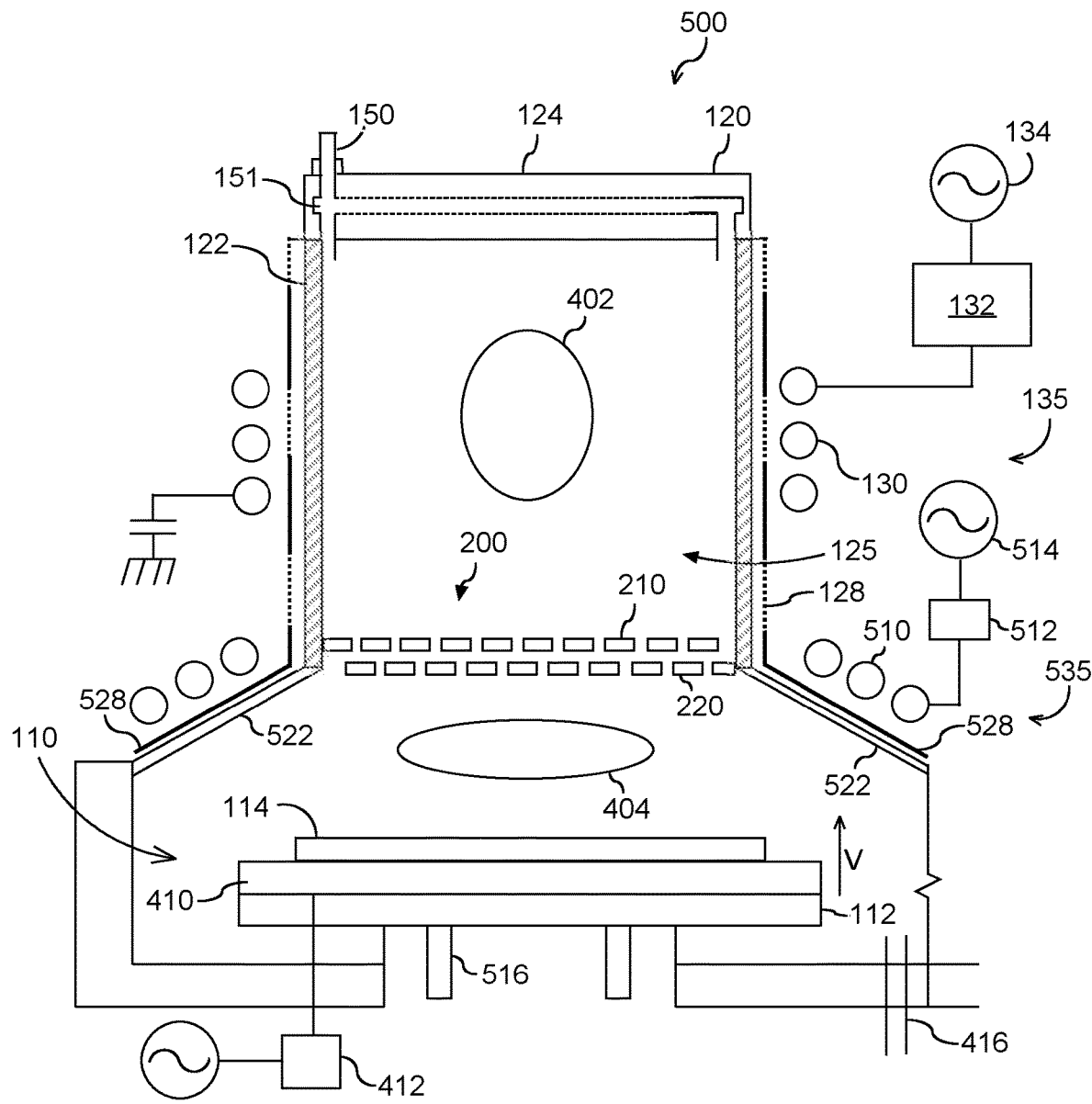
FIG. 6 depicts an example plasma processing apparatus according to example embodiments of the present disclosure.

FIG. 6 depicts a processing chamber 500 similar to that of FIG. 1 and FIG. 5. More particularly, plasma processing apparatus 500 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species (e.g., excited inert gas molecules) are channeled from the plasma chamber 120 to the surface of workpiece 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gas (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 6, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 500 of FIG. 6 is operable to generate a first plasma 402 (e.g., a remote plasma) in the plasma chamber 120 and a second plasma 404 (e.g., a direct plasma) in the processing chamber 110. As shown, the plasma processing apparatus 500 can include an angled dielectric sidewall 522 that extends from the vertical side wall 122 associated with the remote plasma chamber 120. The angled dielectric sidewall 522 can form a part of the processing chamber 110.

A second inductive plasma source 535 can be located proximate the dielectric sidewall 522. The second inductive plasma source 535 can include an induction coil 510 coupled to an RF generator 514 via a suitable matching network 512. The induction coil 510, when energized with RF energy, can induce a direct plasma 404 from a mixture in the processing chamber 110. A Faraday shield 528 can be disposed between the induction coil 510 and the sidewall 522

The pedestal 112 can be movable in a vertical direction V. For instance, the pedestal 112 can include a vertical lift 516 that can be configured to adjust a distance between the pedestal 112 and the separation grid assembly 200. As one example, the pedestal 112 can be located in a first vertical position for processing using the remote plasma 402. The pedestal 112 can be in a second vertical position for processing using the direct plasma 404. The first vertical position can be closer to the separation grid assembly 200 relative to the second vertical position.

The plasma processing apparatus 500 of FIG. 6 includes a bias source having bias electrode 410 in the pedestal 112. The bias electrode 410 can be coupled to an RF power generator 414 via a suitable matching network 412. The processing chamber 110 can include a gas exhaust port 416 for evacuating a gas from the processing chamber 110.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a workpiece, the method comprising:
    generating one or more species in a plasma chamber from an inert gas by inducing a plasma in the inert gas using a plasma source;
    filtering ions generated in the plasma using a separation grid to create a filtered mixture comprising neutral species passing through the separation grid, the separation grid comprising two or more grid plates;
    injecting hydrogen gas with the neutral species of the filtered mixture between two grid plates of the separation grid to generate one or more hydrogen radicals; and
    exposing the workpiece in a processing chamber to the one or more hydrogen radicals.

2. The method of claim 1, wherein the inert gas comprises helium.

3. The method of claim 1, wherein the plasma chamber is separated from the processing chamber by the separation grid.

4. The method of claim 1, wherein the plasma is generated using an inductively coupled plasma source.

5. The method of claim 1, wherein exposing the workpiece in the processing chamber to the one or more hydrogen radicals at least partially removes a photoresist layer on the workpiece.

6. The method of claim 1, wherein exposing the workpiece in a processing chamber to the one or more hydrogen radicals at least partially removes a residual organic material on the workpiece.

7. The method of claim 1, further comprising heating the workpiece to a temperature greater than about 400° C., wherein exposing the workpiece in the processing chamber to the one or more hydrogen radicals modifies silicon atom mobility.

8. The method of claim 1, wherein exposing the workpiece in a processing chamber to the one or more hydrogen radicals at least partially removes a damaged silicon layer.

9. The method of claim 1, wherein exposing the workpiece in a processing chamber to the one or more hydrogen radicals at least partially removes a suboxide layer.

10. The method of claim 1, further comprising mixing the one or more hydrogen radicals with a metal-containing gas to deposit a metal on the workpiece.

11. The method of claim 10, wherein the metal-containing gas comprises titanium.

12. The method of claim 10, wherein the metal-containing gas comprises tantalum.

13. The method of claim 10, wherein the metal-containing gas comprises aluminum.

\* \* \* \* \*